(12) United States Patent
Kihara

(10) Patent No.: US 10,707,204 B2
(45) Date of Patent: Jul. 7, 2020

(54) COMPOSITE SEMICONDUCTOR DEVICE

(71) Applicant: SHARP KABUSHIKI KAISHA, Sakai, Osaka (JP)

(72) Inventor: Seiichiro Kihara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 311 days.

(21) Appl. No.: 15/742,474

(22) PCT Filed: Mar. 31, 2016

(86) PCT No.: PCT/JP2016/060660
§ 371 (c)(1),
(2) Date: Jan. 5, 2018

(87) PCT Pub. No.: WO2017/026139
PCT Pub. Date: Feb. 16, 2017

(65) Prior Publication Data
US 2018/0197855 A1  Jul. 12, 2018

(30) Foreign Application Priority Data
Aug. 7, 2015 (JP) ................. 2015-157706

(51) Int. Cl.
*H01L 27/088* (2006.01)
*H01L 29/417* (2006.01)
(Continued)

(52) U.S. Cl.
CPC ........ *H01L 27/088* (2013.01); *H01L 21/8236* (2013.01); *H01L 24/85* (2013.01); *H01L 27/0629* (2013.01); *H01L 27/0883* (2013.01); *H01L 27/095* (2013.01); *H01L 29/4175* (2013.01); *H01L 29/41758* (2013.01); *H01L 29/7816* (2013.01); *H01L 29/7821* (2013.01); *H01L 29/812* (2013.01); *H01L 29/866* (2013.01); *H01L 29/0696* (2013.01)

(58) Field of Classification Search
CPC ............ H01L 21/8236; H01L 27/0883; H01L 27/095; H01L 29/41758; H01L 29/4175; H01L 29/7816; H01L 29/812; H01L 29/7821
See application file for complete search history.

(56) References Cited

U.S. PATENT DOCUMENTS

2002/0140024 A1  10/2002  Aoki et al.
2005/0051814 A1  3/2005  Miyake et al.
(Continued)

FOREIGN PATENT DOCUMENTS

JP  H08-181307 A  7/1996
JP  2002-299351 A  10/2002
(Continued)

*Primary Examiner* — Zandra V Smith
*Assistant Examiner* — Abbigale A Boyle
(74) *Attorney, Agent, or Firm* — ScienBiziP, P.C.

(57) ABSTRACT

A composite semiconductor device with improved response performance and reliability is provided while an increase in wiring area being suppressed. Fingers 1 are arranged in a plurality of rows and a plurality of columns. A signal inputted via a gate terminal (3) is supplied from intermediate regions in a row-wise direction of gate wires (18) connected to gate electrodes (G) of the same row or two adjacent rows of fingers 1 of the fingers 1 and formed along the rows.

4 Claims, 11 Drawing Sheets

(51) Int. Cl.
*H01L 23/00* (2006.01)
*H01L 29/78* (2006.01)
*H01L 29/812* (2006.01)
*H01L 21/8236* (2006.01)
*H01L 27/095* (2006.01)
*H01L 27/06* (2006.01)
*H01L 29/866* (2006.01)
*H01L 29/06* (2006.01)

(56) References Cited

U.S. PATENT DOCUMENTS

| | | |
|---|---|---|
| 2007/0102757 A1 | 5/2007 | Miyake et al. |
| 2010/0258876 A1 | 10/2010 | Miyake et al. |
| 2011/0254087 A1 | 10/2011 | Miyake et al. |
| 2012/0299095 A1 | 11/2012 | Hashimoto |

FOREIGN PATENT DOCUMENTS

| | | |
|---|---|---|
| JP | 2006-094557 A | 4/2006 |
| JP | 2006-158185 A | 6/2006 |
| JP | 2006-324839 A | 11/2006 |
| JP | 2010-123774 A | 6/2010 |
| JP | 2010-171433 A | 8/2010 |
| JP | 2012-244039 A | 12/2012 |
| WO | 2014/196223 A1 | 12/2014 |
| WO | 2015/033631 A1 | 3/2015 |

COMPOSITE SEMICONDUCTOR DEVICE

TECHNICAL FIELD

The present invention relates to a composite semiconductor device including a semiconductor device including a plurality of normally-off field-effect transistors; and a normally-on field-effect transistor.

BACKGROUND ART

Si (silicon) field-effect transistors that are used mainly in current semiconductor devices are of a normally-off type. A normally-off field-effect transistor is a transistor that is conducting in the presence of the application of a positive voltage between a gate electrode (G) and a source electrode (S) and is nonconducting in the absence of the application of a positive voltage between the gate electrode (G) and the source electrode (S). One way of achieving this normally-off field-effect transistor is a lateral double-diffused MOS field-effect transistor (LDMOSFET). This lateral double-diffused MOS field-effect transistor has such a feature that a source electrode (S) and a drain electrode (D) are formed on the same surface of a semiconductor substrate and, furthermore, such a feature that a connection to an electrode located on the back of a semiconductor can be made by a trench passing from the source electrode (S) through the semiconductor.

Meanwhile, III-N field-effect transistors, such as GaN field-effect transistors, which have been being studied from a practical application standpoint because of their high-withstand-voltage, low-loss, fast-switching, high-temperature operation, and similar features are of a normally-on type. A normally-on field-effect transistor has a negative threshold voltage, is nonconducting in a case where a voltage between a gate electrode (G) and a source electrode (S) is lower than the threshold voltage, and is conducting in a case where the voltage between the gate electrode (G) and the source electrode (S) is higher than the threshold voltage. Use of such a normally-on field-effect transistor in a semiconductor device creates various problems such as unserviceability of a conventional gate drive circuit.

To address these problems, PTL 1, listed below, proposes configuring a normally-off composite semiconductor device by serially connecting a normally-on field-effect transistor and a normally-off field-effect transistor. Further, PTL 2, listed below, proposes a method for, in order to prevent a normally-off field-effect transistor from being broken down by an increase in voltage between a drain electrode (D) and a source electrode (S) of the normally-off field-effect transistor, restricting the voltage between the drain electrode (D) and the source electrode (S) to not higher than the withstand voltage of the normally-off field-effect transistor by connecting a Zener diode between the drain electrode (D) and the source electrode (S) of the normally-off field-effect transistor. PTL 3, listed below, proposes a method for lowering gate resistance by making a connection to a gate-electrode-shunting substrate wire. PTL 4, listed below, describes a configuration in which the offset drain region of a power MOSFET, disposed in between a gate electrode and an n+-type drain region, has a dual offset structure so that both on resistance (Ron) and feedback capacitance (Cgd) are reduced. PTL 5, listed below, describes a method for reducing the resistance of a gate wire by suppressing an increase in wiring resistance of a source and a drain. PTL 6, listed below, describes a configuration in which a gate interconnection pattern is improved so that the number of effective cells is increased by effectively utilizing a chip area or the chip area is reduced.

CITATION LIST

Patent Literature

PTL 1: Japanese Unexamined Patent Application Publication No. 2006-158185 (published on Jun. 15, 2006)
PTL 2: Japanese Unexamined Patent Application Publication No. 2006-324839 (published on Nov. 30, 2006)
PTL 3: Japanese Unexamined Patent Application Publication. No. 2012-244039 (published on Dec. 10, 2012)
PTL 4: Japanese Unexamined Patent Application Publication No. 2010-171433 (published on Aug. 5, 2010)
PTL 5: Japanese Unexamined Patent Application Publication No. 2010-123774 (published on Jun. 3, 2010)
PTL 6: Japanese Unexamined Patent Application Publication. No. 8-161307 (published on Jul. 12, 1996)

SUMMARY OF INVENTION

Technical Problem

However, in most cases, the normally-off semiconductor device of the aforementioned conventional normally-off composite semiconductor device is constituted by a group of small normally-off field-effect transistors called fingers. The gate electrode (G) of each of these fingers is connected by a metal wire from a gate terminal of the normally-off semiconductor device. Therefore, a gate signal that is transmitted to the gate electrode of a finger disposed on the side opposite to the side on which the gate terminal of the normally-off semiconductor device is located lags far behind a gate signal that is transmitted to the gate electrode of a finger disposed near the gte terminal of the normally-off semiconductor device. This delay has caused a decrease in response performance of the composite semiconductor device. Further, in such a case, the composite semiconductor device has not been as reliable as it should be, as a breakdown easily occurs due to the concentration of electric power on a particular normally-off field-effect transistor.

The configurations disclosed in PTLs 1 and 2, listed above, suffer from problems with decrease in response performance and problems with reliability.

The configurations disclosed in PTLs 3 to 6, listed above, cannot provide satisfactory remedies to problems with decrease in response performance or problems with reliability, as although they focus attention on reducing the resistance of a gate wire, they fail to focus attention on reducing variations in the delay of transmission of a signal inputted via the gate terminal as caused depending on the locations of the transistors with respect to the gate terminal.

It is an object of the present invention to provide a composite semiconductor device with improved response performance and reliability while suppressing an increase in wiring area.

Solution to Problem

In order to solve the foregoing problems, a composite semiconductor device according to the present invention is a composite semiconductor device including: a semiconductor device including a plurality of normally-off field-effect transistors, a gate terminal, a drain terminal, and a source terminal; a normally-on field-effect transistor; a second gate terminal; a second drain terminal; and a second source terminal, wherein each of the plurality of normally-off field-effect transistors has a gate electrode connected to the gate terminal, a drain electrode connected to the drain terminal, and a source electrode connected to the source terminal, the semiconductor device has a first surface on which the gate terminal and either of the drain terminal and the source terminal are formed and a second surface on which the other of the drain terminal and the source terminal is formed, the second surface being a surface opposite to the first surface, the second drain terminal is connected to a drain electrode of the normally-on field-effect transistor, the second source terminal is connected to a gate electrode of the normally-on field-effect transistor and a source terminal of the semiconductor device, the second gate terminal is connected to a gate terminal of the semiconductor device, a source electrode of the normally-on field-effect transistor is connected to a drain terminal of the semiconductor device, the plurality of normally-off field-effect transistors are arranged in a plurality of rows and a plurality of columns, and a signal inputted via the gate terminal is supplied from intermediate regions in a row-wise direction of gate wires connected to the gate electrodes of the same row or two adjacent rows of field-effect transistors of the plurality of normally-off field-effect transistors and formed along the rows.

According to the foregoing configuration, the plurality of normally-off field-effect transistors are arranged in a plurality of rows and a plurality of columns, and a signal inputted via the gate terminal is supplied from intermediate regions in a row-wise direction of gate wires connected to the gate electrodes of the same row or two adjacent rows of field-effect transistors of the plurality of normally-off field-effect transistors and formed along the rows. This makes it possible to reduce the variations in the delay of transmission of a signal inputted via the gate terminal as caused due to the influence of wiring resistance depending on the locations of the plurality of normally-off field-effect transistors and to prevent a breakdown from occurring due to the concentration of electric power on a particular finger, thus making it possible to achieve a composite semiconductor device with improved response performance and reliability while suppressing an increase in wiring area.

Advantageous Effects of Invention

An aspect of the present invention makes it possible to achieve a composite semiconductor device with improved response performance and reliability while suppressing an increase in wiring area.

DESCRIPTION OF EMBODIMENTS

Embodiments of the present invention are described below with reference to the drawings. Note, however, that the dimensions, materials, shapes, relative arrangements, methods of processing, and the like of the components described in these embodiments are merely embodiments and the scope of the invention should not be narrowly interpreted because of these embodiments. Furthermore, the drawings are schematic, and the ratios of dimensions and the shapes are different from what they actually are.

Embodiments of the present invention are described below with reference to FIGS. 1 to 11.

Embodiment 1

An embodiment of the present invention is described below with reference to FIGS. 1 to 8.

Figure 1:
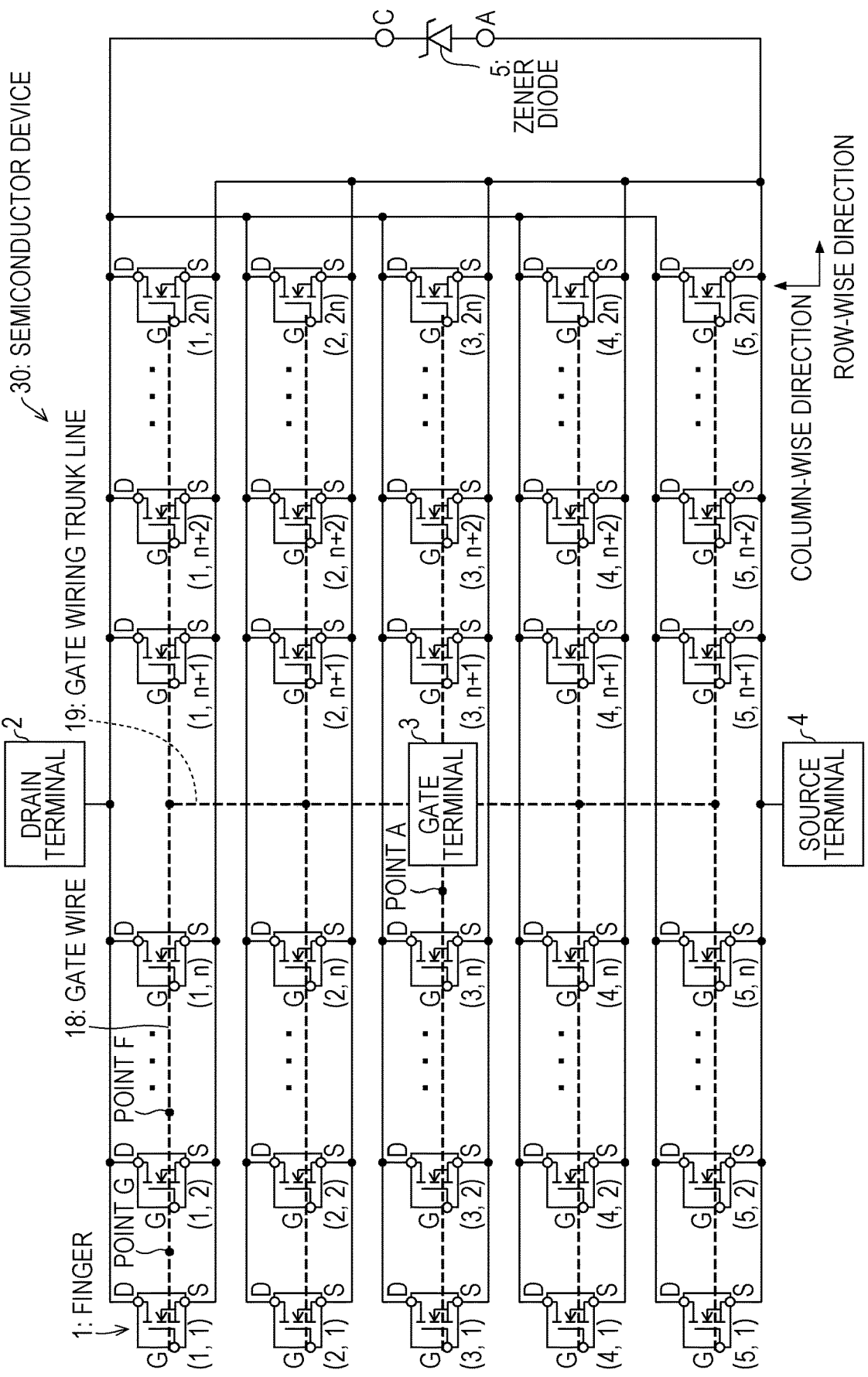
FIG. 1 is a circuit diagram schematically showing a configuration of a semiconductor device of a composite semiconductor device according to Embodiment 1 of the present invention, the semiconductor device including normally-off fingers.

FIG. 1 is a circuit diagram schematically showing a configuration of a semiconductor device 30 of a composite semiconductor device 40, the semiconductor device 30 including normally-off fingers 1.

As illustrated, the normally-off semiconductor device (normally-off lateral field-effect transistor) 30 includes 5×2n normally-off fingers 1 arranged in five rows and 2n columns, a drain terminal 2, a gate terminal 3, a source terminal 4, and a Zener diode 5. It should be noted that the present embodiment is described by taking, as an example, a case where n is 1000, although n needs only be a natural number of 2 or larger.

Figure 2:
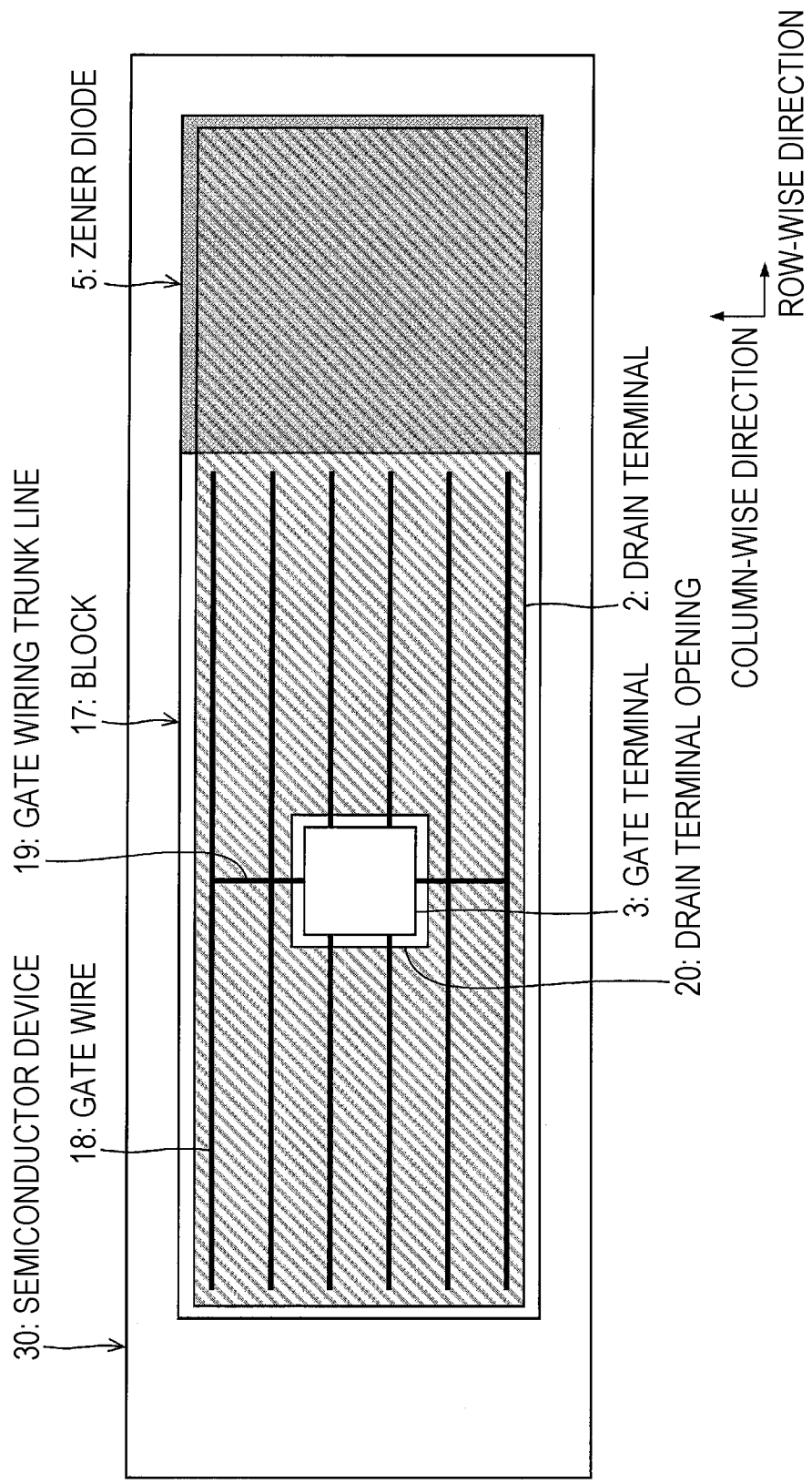
FIG. 2 is a diagram of the semiconductor device illustrated in FIG. 1 as viewed from above a surface of the semiconductor device on which a gate terminal is formed.

FIG. 2 is a diagram of the normally-off semiconductor device 30 illustrated in FIG. 1 as viewed from above a surface of the semiconductor device 30 on which the gate terminal 3 is formed.

As illustrated, in the normally-off semiconductor device 30, a block 17, which is a group of fingers 1, is disposed on the left side of the drawing, and the Zener diode 5 is disposed on the right side of the drawing so as to be adjacent to the block 17.

The drain terminal 2 is formed in the uppermost part of the block 17 so as to be exposed, and the gate terminal 3 is exposed through a drain terminal opening 20 provided in the central part of the drain terminal 2. The drain terminal 2 and the gate terminal 3 are formed by the same layer, and the drain terminal 2 and the gate terminal 3 are electrically insulated from each other by the lateral thickness of an insulating layer (not illustrated) formed so as to surround the gate terminal 3.

(Fingers)

As illustrated in FIG. 1, since the normally-off semiconductor device (normally-off lateral field-effect transistor) 30 is of a normally-off type, each of the fingers 1 is a small normally-off field-effect transistor including a gate electrode (G), a drain electrode (D), and a source electrode (S). The normally-off semiconductor device 30 includes a group (block 17) of these small field-effect transistors called fingers 1. It should be noted that the number n of fingers 1 ranges from several thousands to several tens of thousands depending on current capacity and it is common to constitute a group (block) of several thousands to several tens of thousands of fingers 1.

The present embodiment is described by taking, as an example, a case where the normally-off semiconductor device 30 includes a group (block 17) of 5×2000 fingers 1 arranged in five rows and two thousand columns along a row-wise direction and a column-wise direction. As mentioned above, the number of fingers 1 is not limited to this number. However, since the normally-off semiconductor device 30 is a normally-off lateral field-effect transistor, the number of columns is larger than the number of rows.

It should be noted that the source electrodes (S) of the (1, 1) to (5, 2n) fingers 1 need to be connected to the source terminal 4 disposed on the back as be described later. Therefore, it is preferable that each of the fingers 1 has a lateral double-diffused MOS field-effect transistor (LD-MOSFET) structure, and in the present embodiment, each of the fingers 1 is a lateral double-diffused MOS field-effect transistor. This is because a lateral double-diffused MOS field-effect transistor has such a feature that a source electrode and a drain electrode are formed on the same surface of a semiconductor substrate and, furthermore, a connection to an electrode located on the back of a semiconductor can be made by a trench passing from the source electrode through the semiconductor.

Figure 3:
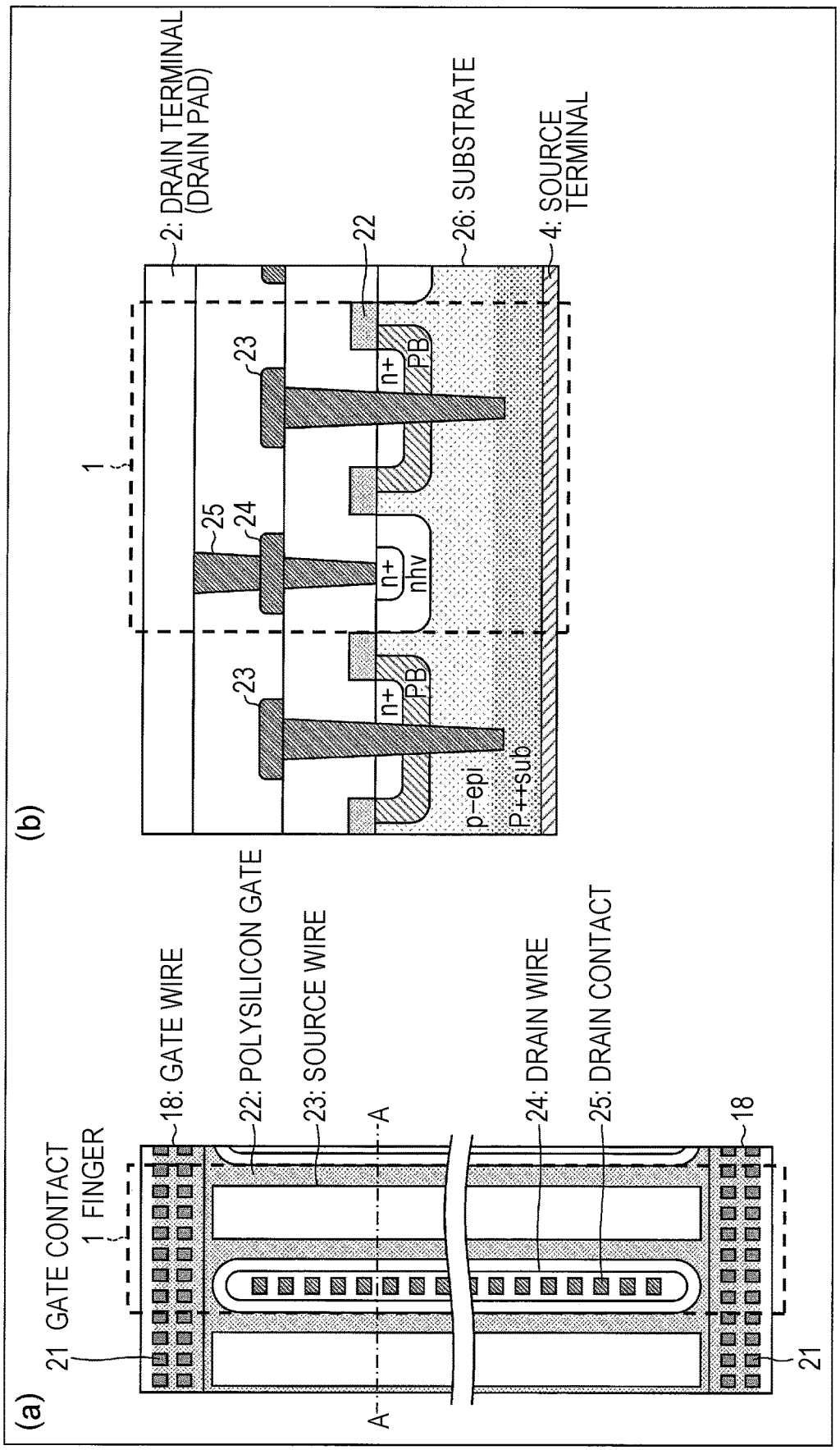
FIG. 3 illustrates (a) a plan view and (b) a cross-sectional view schematically showing a configuration of a normally-off finger of the semiconductor device illustrated in FIG. 1.

FIG. 3 schematically shows a configuration of a normally-off finger 1 of the semiconductor device 30 illustrated in FIG. 1. (a) of FIG. 3 is a plan view of the finger 1, and (b) of FIG. 3 is a cross-sectional view of the finger 1 as taken along line A-A in (a) of FIG. 3.

As illustrated in (a) of FIG. 3 and (b) of FIG. 3, each finger 1 of the block 17 may be structured, for example, in the following way.

The finger 1 includes a P++-type Si substrate (P++sub). Formed on an upper surface of the P++-type Si substrate (P++sub) is a P-type epitaxial layer (P-epi) serving as a semiconductor region. Moreover, formed in an upper part of the P-type epitaxial layer (P-epi) are a P-type body region (PB) and as n-type diffusion layer (nhv) that are distantly positioned. The P-type body region (PB) and an n+ layer (n+) form a source region of the finger 1, and the n-type diffusion layer (nhv) and the n+ layer (n+) form a drain region of the finger 1.

As illustrated in (b) of FIG. 3, a source wire 23 including the source electrode (S) is connected to the source region and the P++-type Si substrate (P++sub) via a through-hole; therefore, the source wire 23 is also connected to the source terminal 4, which is a substrate electrode formed on a lower surface of the P++-type Si substrate (P++sub). Meanwhile, a drain wire 24 including the drain electrode (D) is connected to the drain region via a through-hole and is also connected to the drain terminal 2 (also called a drain pad) via a drain contact (drain through-hole) 25. Moreover, as illustrated in (a) of FIG. 3, the finger 1 has a polysilicon gate 22 connected to a gate wire 18 including the gate electrode (G) via a gate contact (gate through-hole) 21.

It should be noted that the gate wire 18 including the gate electrode (G), the source wire 23 including the source electrode (S), and the drain wire 24 including the drain electrode (D) are formed by the same layer, and the drain terminal 2 and the gate terminal 3, which is not illustrated here, are formed by the same layer, so that the gate terminal 3 resides in a part of the drain terminal opening 20 of the drain terminal 2. Moreover, the gate terminal 3, which is not illustrated here, and either the gate wire 18 or the at gate wiring trunk line 19 (not illustrated) are connected to each other via a through-hole (not illustrated).

Further, since FIG. 1, described above, is a circuit diagram for illustrating a relative positional relationship between the gate terminal 3 and the gate electrodes (G) of the fingers 1 and an electrical connection relationship between them, FIG. 1 is illustrated in such a simple way that one gate wire 18 is connected to the gate electrode (G) of each finger 1 of the same row. However, in the present embodiment, as illustrated in (a) of FIG. 3, two gate wires 18 are connected to the gate electrode (G) of each finger 1 of the same row, and these gate wires 18 serve as common gate wires in the two adjacent rows. However, this does not imply any limitation. One gate wire 18 may be connected to the gate electrode (G) of each finger 1 of the same row.

(Gate Terminal of Normally-off Semiconductor Device)

Problems with variations in the delay of transmission of a signal as caused due to the influence of variations in wiring resistance can be solved by placing the gate electrodes of the fingers at equal wiring distances from the gate terminal of the normally-off semiconductor device. However, making the wiring distances equal is not realistic, as doing so invites an increase in wiring area.

To address this problem, the present embodiment has employed such a configuration as that described below which makes it possible to minimize the variations in the wiring distances between the gate terminal 3 of the normally-off semiconductor device and the gate electrodes (G) of the fingers 1 and to reduce the variations in the delay of transmission of a signal without an increase in wiring area.

As illustrated in FIG. 1, the gate terminal 3 of the normally-off semiconductor device 30 is connected to the gate electrodes (G) of the (1, 1) to (5, 2n) fingers 1. Moreover, as illustrated in FIGS. 2 and 3, the present embodiment is configured such that, in order that a signal inputted via the gate terminal 3 can be supplied from intermediate regions in the row-wise direction of gate wires 18 connected to the gate electrodes (G) of the same row of fingers 1 (e.g. the (1, 1) to (1, 2n) fingers 1) or two adjacent rows of fingers 1 (e.g. (1, 1) to (2, 2n) fingers 1) of the 5×2n fingers 1 and formed along the row-wise direction, the gate terminal 3 is disposed in a central region of the group (block 17) of 5×2n fingers 1 and the gate wiring trunk line 19 is used to connect the gate terminal 3 with the intermediate regions in the row-wise direction of the gate wires 18. This is intended, for example, to reduce the difference between the wiring resistance between the gate terminal 3 and the gate electrode (G) of the (3, n) finger 1 and the wiring resistance between the gate terminal 3 and the gate electrode (G) of the (1, 1) finger 1.

Disposing the gate terminal 3 in the central region of the group (block 17) of fingers 1 makes it possible to reduce the differences in wiring resistance as caused by the differences in the distances between the gate electrodes (G) of the fingers 1 and the gate terminal 3. Further, supplying, from the intermediate regions in the row-wise direction of the gate wires 18, a signal inputted via the gate terminal 3 makes it possible to reduce the variations in the delay of transmission of a signal as caused by differences in the distances between the gate electrodes (G) of the fingers 1 of the same row and the starting point of supply of a signal inputted via the gate terminal 3.

It should be noted that in a case where two thousand fingers 1 are disposed in one row as in the case of the present embodiment, the intermediate region in the row-wise direction of a gate wire 18 means that part of the gate wire 18 which is present between the 1000th finger 1 and the 1001st finger 1, e.g. between the (1, n) finger 1 and the (1, n+1) finger 1.

Further, in a case where fingers 1 are arranged in five rows and two thousand columns as in the case of the present embodiment, the central region of the group (block 17) of 5×2n fingers 1 means a region located between the (3, n) finger 1 and the (3, n+1) finger 1.

The foregoing configuration makes it possible to, while suppressing an increase in wiring area, reduce the variations in the delay of transmission of a signal inputted via the gate terminal 3 among the plurality of fingers 1 as caused due to the influence of wiring resistance and to prevent a breakdown from occurring due to the concentration of electric power on a particular finger 1, thus making it possible to achieve a semiconductor device 30 and a composite semiconductor device 40 including a semiconductor device 30 with improved response performance and reliability.

(Drain Terminal and Source Terminal of Normally-off Semiconductor Device)

As illustrated in FIG. 1, the drain electrodes (D) of the (1, 1) to (5, 2n) fingers 1 are connected to the drain terminal 2 of the normally-off semiconductor device 30. Meanwhile, the source electrodes (S) of the (1, 1) to (5, 2n) fingers 1 are connected to the source terminal 4 of the normally-off semiconductor device 30.

(Zener Diode)

As illustrated in FIG. 1, the normally-off semiconductor device 30 includes the Zener diode 5 in order to prevent a breakdown from occurring in a case where a voltage that is equal to or higher than the withstand voltage of the normally-off semiconductor device 30 is applied to the normally-off semiconductor device 30. The Zener diode 5 has an anode electrode (A) connected to the source terminal 4 and a cathode electrode (C) connected to the drain terminal 2. Since the Zener diode 5 is less influenced by the aforementioned wiring resistance, no special consideration need to be given to the position in which it is disposed. In the present embodiment, as illustrated in FIG. 2, the Zener diode 5 is disposed outside the group (block 17) of fingers 1.

(Block)

Figure 4:
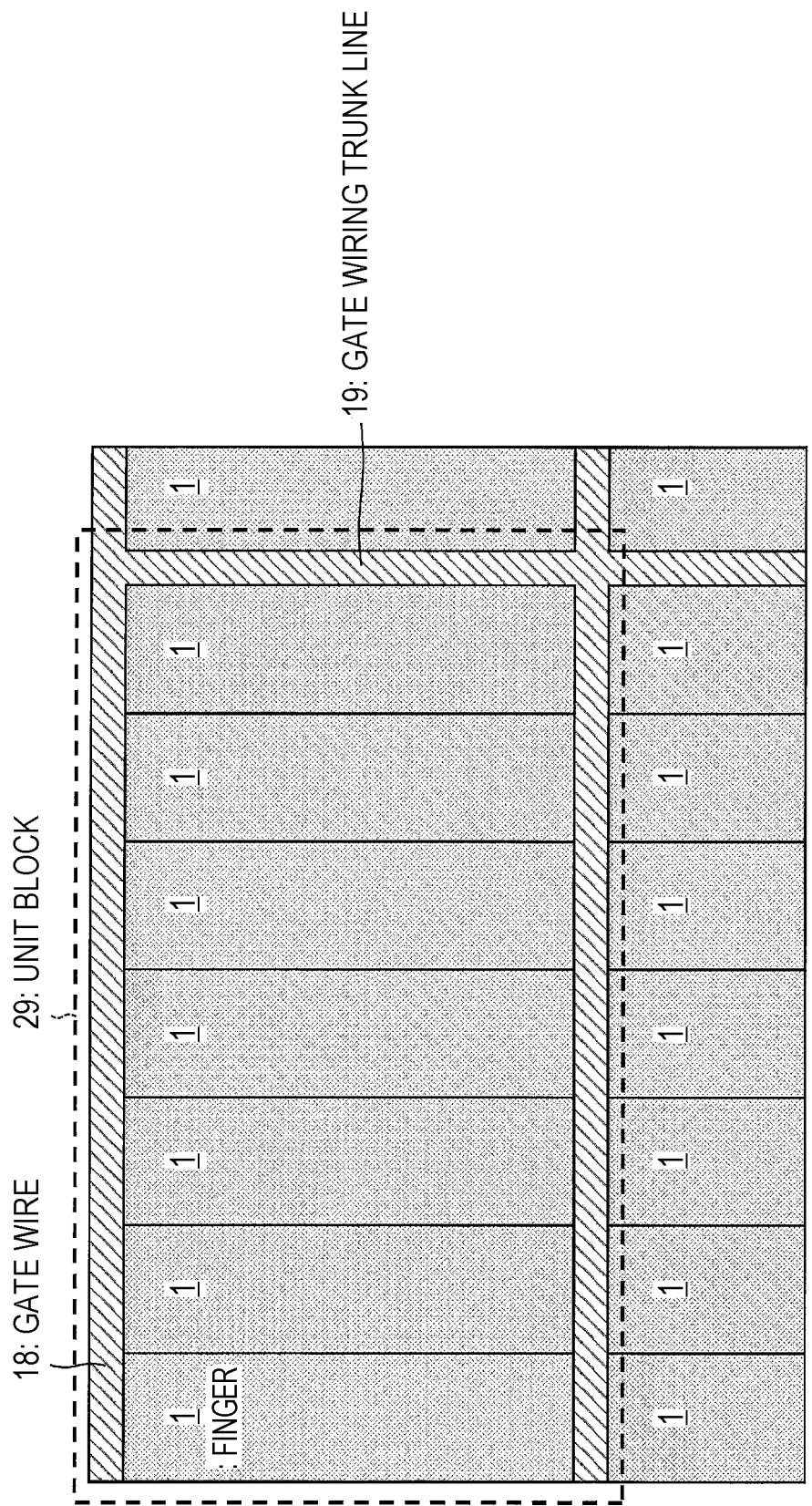
FIG. 4 is a diagram showing a plurality of unit blocks of the semiconductor device illustrated in FIG. 1.

FIG. 4 is a plan view showing a part of unit blocks 29 constituting a block 17 into which 5×2000 fingers 1 have been integrated.

In the present embodiment, each unit block 29 is constituted by one thousand fingers 1, and the block 17 is constituted by ten unit blocks 29.

The operation of the normally-off semiconductor device 30 is described below with reference to FIGS. 5 and 6.

(Evaluation Circuit)

Figure 5:
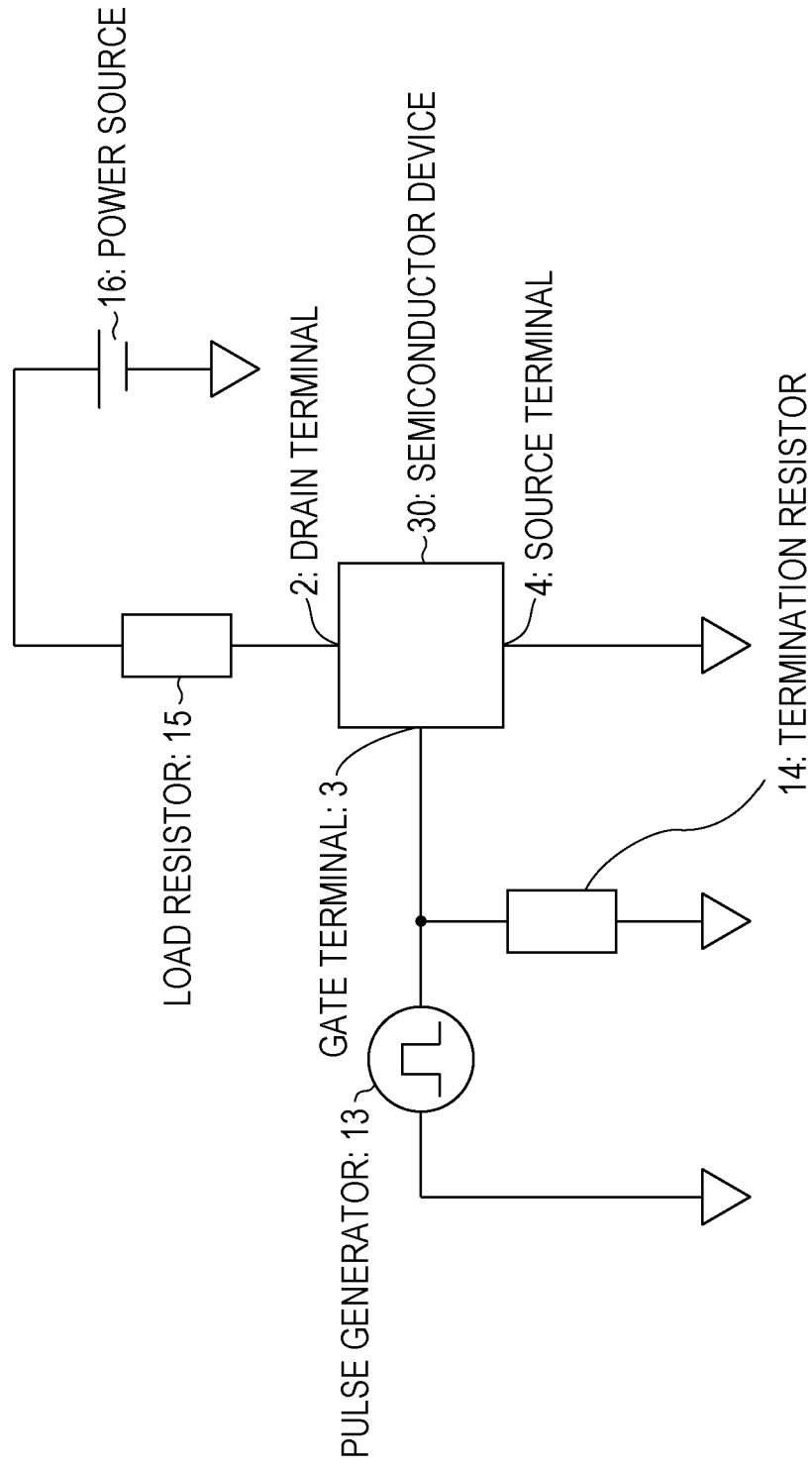
FIG. 5 is a circuit diagram schematically showing a configuration of an evaluation circuit that evaluates the operation of the semiconductor device illustrated in FIG. 1.

FIG. 5 is a circuit diagram schematically showing a configuration of an evaluation circuit that evaluates the operation of the normally-off semiconductor device 30 illustrated in FIG. 1.

As illustrated, the evaluation circuit includes the normally-off semiconductor device 30, a pulse generator 13, a termination resistor 14, a load resistor 15, and a power source 16. A first end of the pulse generator 13 is grounded, and a second end of the pulse generator 13 is both connected to a second end of the termination resistor 14 whose first terminal is grounded and connected to the gate terminal 3 of the normally-off semiconductor device 30. The drain terminal 2 of the normally-off semiconductor device 30 is connected to a first end of the load resistor 15, and a second end of the load resistor 15 is connected a positive terminal of the power source 16 whose negative terminal is grounded. The source terminal 4 of the normally-off semiconductor device 30 is grounded.

(Operation of Normally-off Semiconductor Device)

In general, a normally-off semiconductor device tends to be affected by wiring resistance in such a way that an off-delay time (i.e. a period of time from a timing at which V (GATE TERMINAL) is brought to a low level to a timing at which V (DRAIN TERMINAL) is brought to a high level) is longer than an on-delay time (i.e. a period of time from a timing at which V (GATE TERMINAL) is brought to a high level to a timing at which V (DRAIN TERMINAL) is brought to a low level).

Moreover, a common normally-off semiconductor device constituted by several thousands to several tens of thousands of fingers requires a reduction in wiring resistance for a reduction in off-delay time, and requires measures to prevent a particular finger that is markedly high in wiring resistance from being broken down by the concentration of current on the particular finger.

To address this problem, the normally-off semiconductor device 30 according to the present embodiment is configured such that in order that a signal inputted via the gate terminal 3 can be supplied from intermediate regions in the row-wise direction of gate wires 18 connected to the gate electrodes (G) of the same row of fingers 1 (e.g. the (1, 1) to (1, 2n) fingers 1) or two adjacent rows of fingers 1 (e.g. (1, 1) to (2, 2n) fingers 1) of the 5×2n fingers 1 and formed along the row-wise direction, the gate terminal 3 is disposed in a central region of the group (block 17) of 5×2n fingers 1 and the gate wiring trunk line 19 is used to connect the gate terminal 3 with the intermediate regions in the row-wise direction of the gate wires 18.

Figure 6:
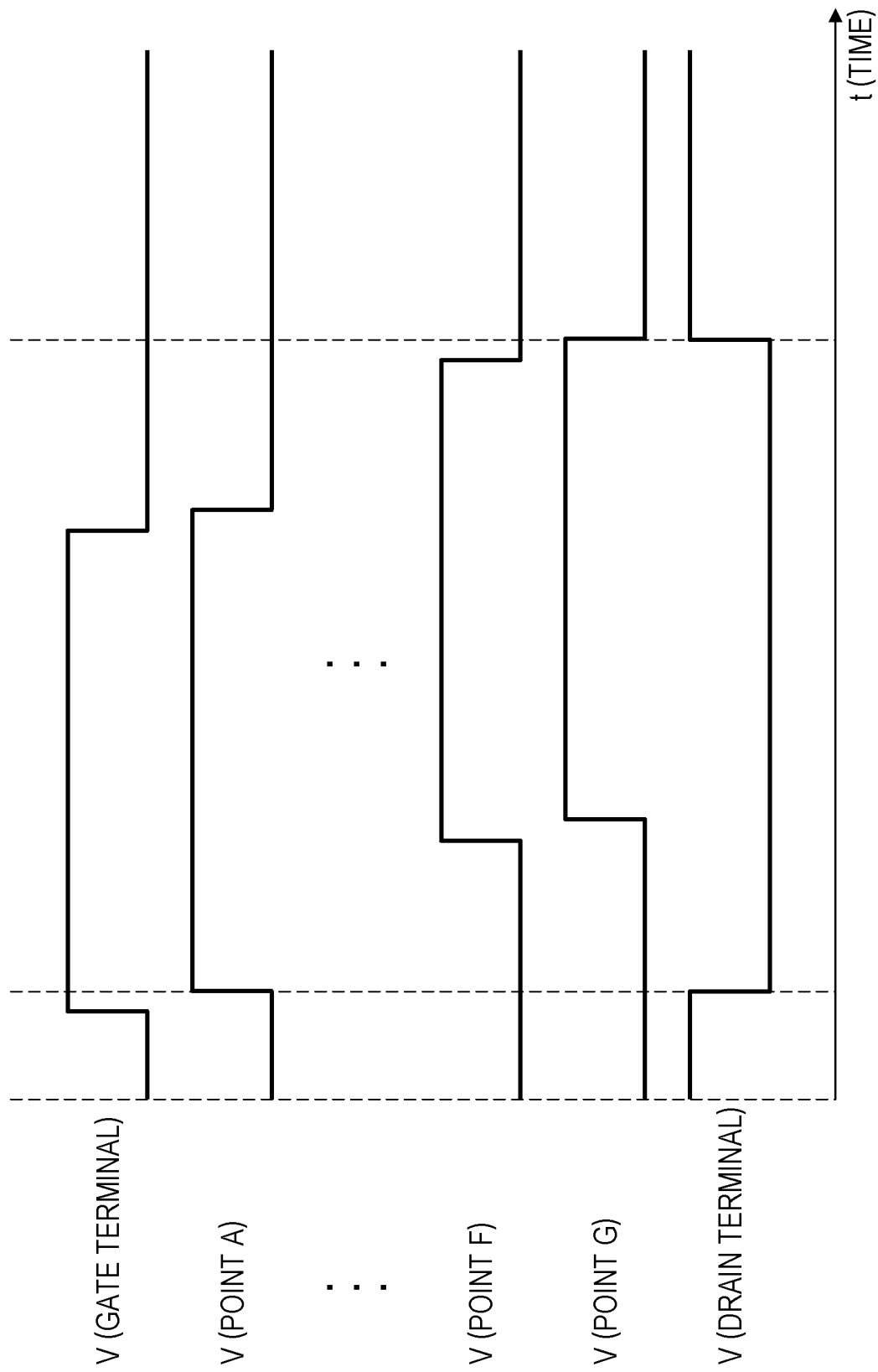
FIG. 6 is a diagram showing operation timings of the semiconductor device illustrated in FIG. 1.

FIG. 6 is a diagram showing operation timings of the normally-off semiconductor device 30 illustrated in FIG. 1.

FIG. 6 illustrates voltages that indicate changes in voltage at points A, F, and G of the normally-off semiconductor device 30 illustrated in FIG. 1. V (GATE TERMINAL), V (POINT A), V (POINT F), V (POINT G), and V (DRAIN TERMINAL) represent the voltage of the gate terminal 3 of the normally-off semiconductor device 30, the voltage at the point A in FIG. 1, the voltage at the point F in FIG. 1, the voltage at the point G in FIG. 1, and the voltage of the drain terminal 2 of the normally-off semiconductor device 30, respectively.

As illustrated by V (GATE TERMINAL), a voltage (high level) that is equal to or higher than a gate voltage at which the normally-off semiconductor device 30 becomes turned on is inputted to the gate terminal 3. Then, first, as illustrated by V (POINT A), a voltage (high level) that is equal to or higher than a gate voltage at which the (3, n) finger 1, which is closest to the gate terminal 3, becomes turned on is inputted to the gate electrode (G) of the (3, n) finger 1 with a delay under the least influence of wiring resistance. When the (3, n) finger 1, which is closest to the gate terminal 3, becomes turned on, a current flows through the normally-off semiconductor device 30. This is reflected in V (DRAIN TERMINAL); that is, V (DRAIN TERMINAL) changes from a high level to a low level at a timing when the (3, n) finger 1, which is closest to the gate terminal 3, becomes turned on.

After that, voltages (high level) that are equal to or higher than gate voltages at which fingers 1 concerned become turned on are inputted to the gate electrodes (G) of the fingers 1 concerned with sequential delays under the influence of wiring resistance according to distance from the gate terminal 3. Then, as illustrated by V (POINT F), a voltage (high level) that is equal to or higher than a gate voltage at which the (1, 2) finger 1 becomes turned on is inputted to the gate electrode (G) of the (1, 2) finger 1. After that, as illustrated by V (POINT G), a voltage (high level) that is equal to or higher than a gate voltage at which the (1, 1) finger 1, which is farthest from the gate terminal 3, becomes turned on is inputted to the gate electrode (G) of the (1, 1) finger 1 with a delay under the most influence of wiring resistance. It should be noted that since V (DRAIN TERMINAL) has already changed from a high level to a low level by each of these timings, V (DRAIN TERMINAL) shows no change in voltage and maintains the low level at these timings.

It should be noted that although the (1, 1) finger 1 has been taken as an example of the finger 1 that is most influenced by wiring resistance and disposed in the farthest position from the gate terminal 3, it is needless to say that the (1, 1) (1, 2n), (5, 1), and (5, 2n) fingers 1 are most influenced by wiring resistance, as they are placed at the same distance from the gate terminal 3.

As illustrated by V (GATE TERMINAL), a return to a low level is made after a certain period of input to the gate terminal 3 of a voltage (high level) that is equal to or higher than a gate voltage at which the normally-off semiconductor device 30 becomes turned on. Then, as illustrated by V (POINT A), the (3, n) finger 1 becomes turned off with a delay under the influence of wiring resistance. However, the change in current is not reflected in V (DRAIN TERMINAL), as the other fingers 1 are still turned on. As time passes, the other fingers 1 similarly become turned off in sequence with delays under the influence of wiring resistance, and after the (1, 2) finger 1 has become turned off, and after that, the (1, 1) finger 1 finally becomes turned off. V (DRAIN TERMINAL) maintains the low level until the (1, 1) finger 1 becomes turned off, and V (DRAIN TERMINAL) changes to a high level at a timing when the (1, 1) finger 1 becomes turned off.

The foregoing configuration makes it possible to, without an increase in wiring area, reduce the variations in the delay of transmission of a signal inputted via the gate terminal 3 among the plurality of fingers 1 as caused due to the influence of wiring resistance and to prevent a breakdown from occurring due to the concentration of electric power on a particular finger 1, thus making it possible to achieve a semiconductor device 30 with improved response performance and reliability.

(Normally-off Composite Semiconductor Device)

Figure 7:
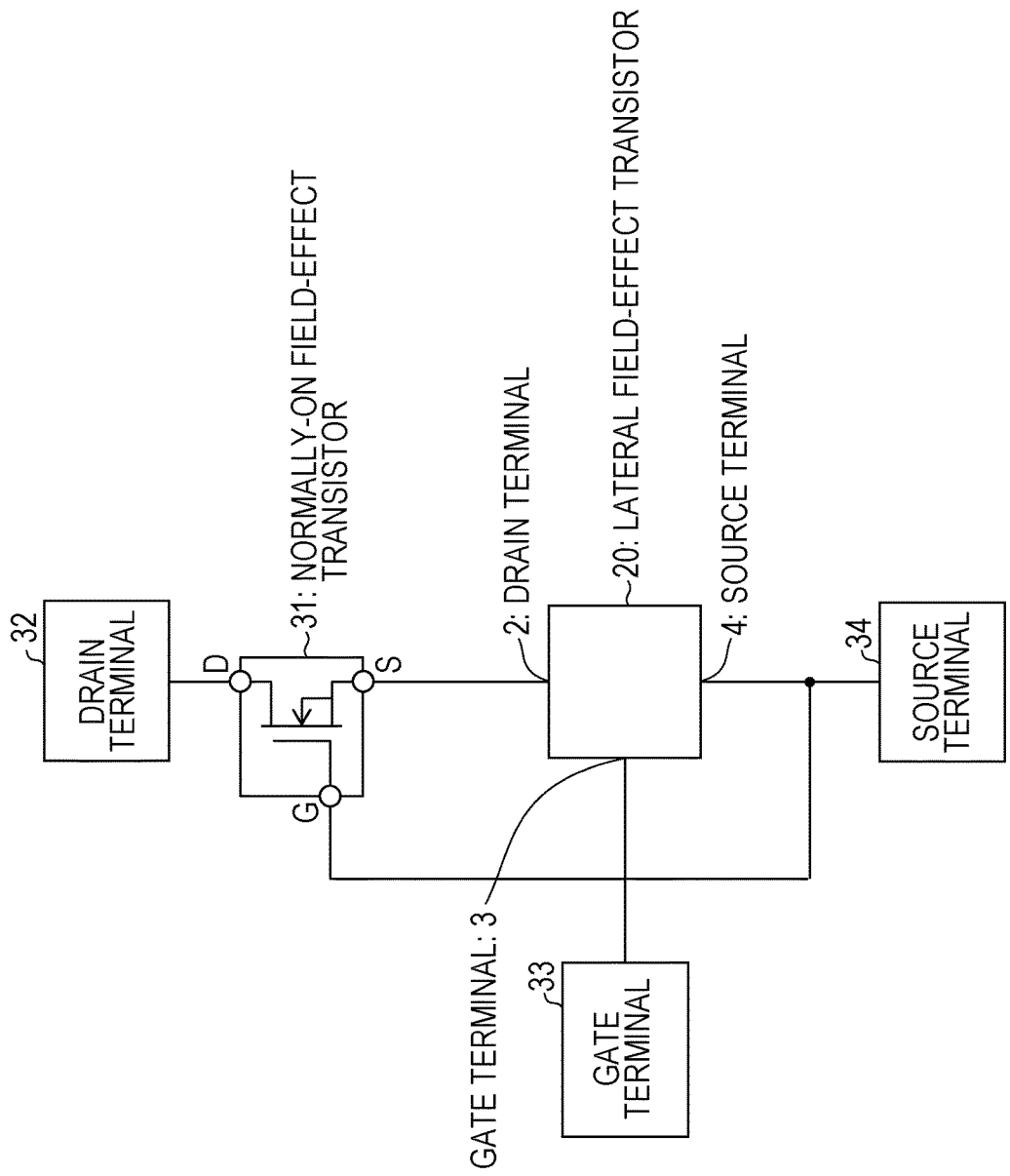
FIG. 7 is a circuit diagram of a composite semiconductor device including the semiconductor device including normally-off fingers as illustrated in FIG. 1 and a normally-on field-effect transistor.

FIG. 7 is a circuit diagram schematically showing a configuration of a composite semiconductor device 40.

As illustrated, the normally-off composite semiconductor device 40 in a normally-off semiconductor device 30, a normally-on field-effect transistor 31, a drain terminal 32, a gate terminal 33, and a source terminal 34.

The normally-on field-effect transistor 31 has a drain electrode (D) connected to the drain terminal 32 of the composite semiconductor device 40, a gate electrode (G) connected to the source terminal 34 of the composite semiconductor device 40, and a source electrode (S) connected to a drain terminal 2 of a lateral field-effect transistor 20.

Moreover, the normally-off semiconductor device 30 has a gate terminal 3 connected to the gate terminal 33 of the composite semiconductor device 40 and has a source terminal 4 connected to the source terminal 34 of the composite semiconductor device 40. It should be noted that the source terminal 34 of the composite semiconductor device 40 is connected to the gate electrode (G) of the normally-on field-effect transistor 31 and the source terminal 4 of the normally-off semiconductor device 30.

Since the composite semiconductor device 40 performs withstand-voltage control with the normally-on field-effect transistor 31 and performs current control with a normally-off field-effect transistor or, specifically, the normally-off semiconductor device 30, the off-delay time of the normally-off semiconductor device 30 serves as the biggest factor that determines the off-delay time in the composite semiconductor device 40.

The composite semiconductor device 40 uses a semiconductor device 30 with improved response performance and reliability that makes it possible to, without an increase in wiring area, reduce the variations in the delay of transmission of a signal inputted via the gate terminal among the plurality of fingers 1 as caused due to the influence of wiring resistance and to prevent a breakdown from occurring due to the concentration of electric power on a particular finger 1, thus making it possible to achieve a composite semiconductor device 40 with improved response performance and reliability.

Figure 8:
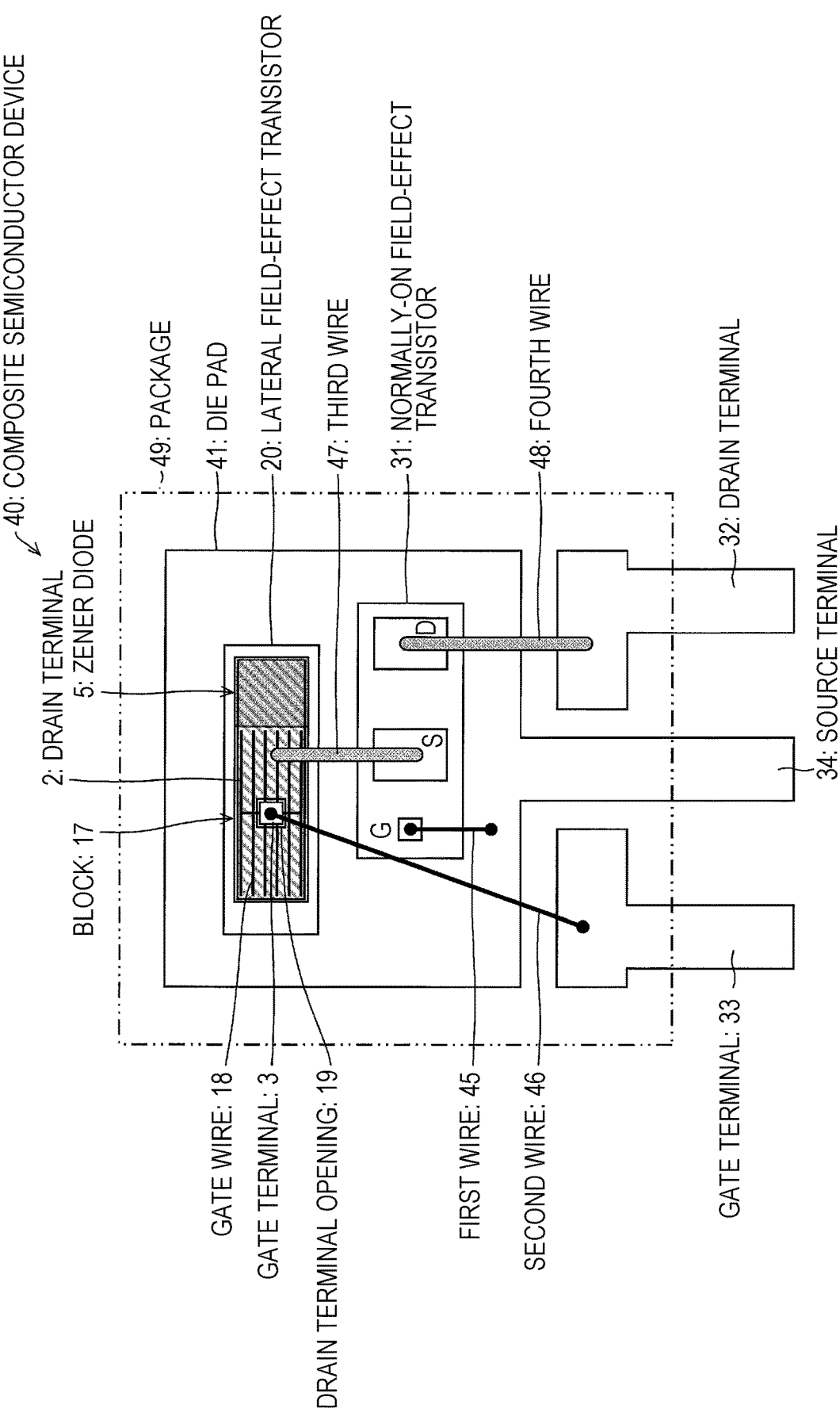
FIG. 8 is a diagram schematically showing the composite semiconductor device illustrated in FIG. 7.

FIG. 8 is a diagram schematically showing a configuration of a packaged composite semiconductor device 40.

As illustrated, the composite semiconductor device 40 includes a normally-off semiconductor device 30 formed on a Si substrate, a normally-on field-effect transistor 31 formed on a III-N substrate such as a GaN substrate, and a die pad 41 on which the normally-off semiconductor device 30 and the normally-on field-effect transistor 31 are die bonded.

The gate electrode (G) of the normally-on field-effect transistor 31 and the die 41, whose one end serves as the source terminal 34 of the composite semiconductor device 40, are connected to each other by a first wire 45. The gate terminal 3 of the normally-off semiconductor device 30 and the gate terminal 33 of the composite semiconductor device 40 are connected to each other by a second wire 46. The drain terminal 2 of the normally-off semiconductor device 30 and the source electrode (S) of the normally-on field-effect transistor 31 are connected to each other by a third wire 47. The drain electrode (D) of the normally-on field-effect transistor 31 and the drain terminal 32 of the composite semiconductor device 40 are connected to each other by a fourth wire 48. In the normally-off semiconductor device 30, the source terminal 4 (not illustrated), which is a substrate electrode formed on the back of a chip connected to a source wire by a trench, is connected to the die pad 41.

The composite semiconductor device 40 is constituted by partly sealing three terminals, namely the drain terminal 32, the gate terminal 33, and the source terminal 34, with a package 49.

It should be noted that since wire bonding performed on a thin metal layer may cause the metal layer to be broken through, the present embodiment uses a thick metal layer called "power metal" to form a metal layer in a place where wire bonding covering the drain terminal land the gate terminal 3 of the normally-off semiconductor device 30 is needed.

It should be noted that since a current flowing through the normally-on field-effect transistor 31 flows through the third wire 47 and the fourth wire 48, the back of the normally-on field-effect transistor 31 is used mainly for fixing the chip and fixed to the die pad 41 by an electrically conductive material, but may be fixed to the die pad 41 by an insulator.

Further, since the normally-on field-effect transistor 31 formed on the III-N substrate, such as a GaN substrate, is lower in on resistance per unit area than the normally-off semiconductor device 30 formed on the Si substrate, the normally-on field-effect transistor 31 allows passage of a larger current than the normally-off semiconductor device 30 does, with the two field-effect transistors being equal in size.

In order to, while die bonding both chips, namely the normally-on field-effect transistor 31 and the semiconductor device 30, to the die pad 41 and securing the space in which to form the wires, allow passage of a large current through the normally-off semiconductor device 30 formed on the Si substrate, it is most efficient, in terms of area, to form both chips in rectangular shapes as illustrated in FIG. 8.

Since the composite semiconductor device 40 includes a rectangular normally-on field-effect transistor 31 and a rectangular normally-off semiconductor device 30, it is possible to pass a large current through the normally-off semiconductor device 30 and achieve an efficient arrangement in terms of area.

Further, since the composite semiconductor device 40 has the Zener diode 5 contained in the normally-off semiconductor device 30, a breakdown can be prevented from occurring in a case where a voltage that is equal to or higher than the withstand voltage of the normally-off semiconductor device 30 is applied to the normally-off semiconductor device 30.

Although the present embodiment has been described by taking, as an example, a case where the gate electrode (G), the drain electrode (D), and the source electrode (S) of the normally-on field-effect transistor 31 are formed on the same surface, the present embodiment is not limited to this example. For example, the gate electrode (G) and the drain electrode (D) of the normally-on field-effect transistor 31 may be formed on the same surface (upper surface) and the source electrode (S) of the normally-on field-effect transistor 31 may be formed on a surface (lower surface) opposite to the same surface. In this case, it is preferable that the gate terminal 3 and the source terminal 4 of the normally-off semiconductor device 30 be formed on the same surface (upper surface) and the drain terminal 2 be formed on the surface (lower surface) opposite to the same surface.

It should be noted that since in a case where the composite semiconductor device 40 is required to have a high withstand voltage, the normally-on field-effect transistor 31 of the composite semiconductor device 40 is required to have a high withstand voltage and a low on resistance, the normally-on field-effect transistor 31 tends to be large in size.

Further, the normally-off semiconductor device 30 requires a large-area drain electrode (D) for connecting to the source electrode (S) of the normally-on field-effect transistor 31, and requires a high threshold voltage and a low on resistance to prevent a malfunction.

In general, a normally-off composite semiconductor device including a normally-off semiconductor device and a normally-on field-effect transistor exhibits a phenomenon in which the voltage between the drain electrode and the source electrode of the normally-off semiconductor device becomes high. As compared with a device constituted solely by a normally-off field-effect transistor, the normally-off composite semiconductor device becomes turned on under higher electric power. Therefore, when some of the fingers of the normally-off semiconductor device become turned on earlier than others, a thermal breakdown occurs due to the concentration of electric power.

The composite semiconductor device 40 according to the present embodiment uses a semiconductor device 30 with improved reliability that makes it possible to, without an increase in wiring area, to prevent a breakdown from occurring due to the concentration of electric power on a particular finger 1, thus making it possible to achieve a composite semiconductor device 40 with improved reliability.

It should be noted that although the present embodiment has been described by taking a lateral field-effect transistor as an example, the present invention is applicable to field-effect transistors in general as well as lateral field-effect transistors.

Embodiment 2

Next, Embodiment 2 of the present invention is described with reference to FIG. 9. The present embodiment differs from Embodiment 1 in that a normally-off semiconductor device 30a according to the present embodiment as its gate terminal 3 disposed outside the block 17. In other respects, the present embodiment is the same as Embodiment 1. For convenience of explanation, members having the same functions as those illustrated in the drawings of Embodiment 1 are given the same reference signs and, as such, are not described below.

Figure 9:
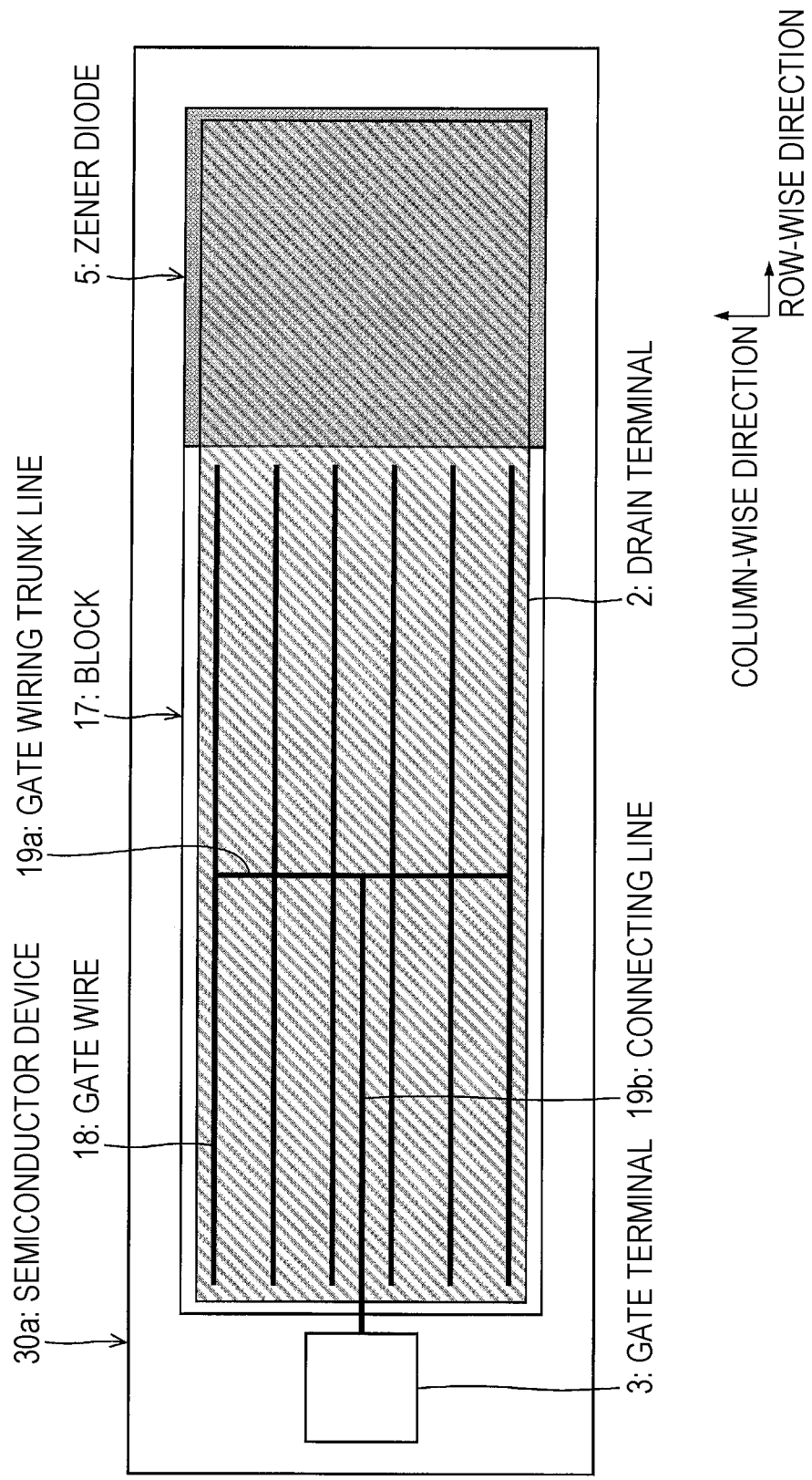
FIG. 9 is a diagram of a semiconductor device of a composite semiconductor device according to Embodiment 2 of the present invention as viewed from above a surface of the semiconductor device on which a gate terminal is formed.

FIG. 9 is a diagram of the normally-off semiconductor device 30a as viewed from above a surface of the semiconductor device 30a on which the gate terminal 3 is formed.

As illustrated, in the normally-off semiconductor device 30a, the gate terminal 3 is disposed outside the block 17. Moreover, the normally-off semiconductor device 30a includes one gate wiring trunk line 19a connected to the intermediate regions in the row-wise direction of the gate wires 18 and formed along the column-wise direction and a connecting line 19b connecting an intermediate region in the column-wise direction of the gate wring trunk line 19a with the gate terminal 3.

It should be noted that the gate wires 18, the gate wiring trunk line 19a, the connecting line 19b, the source wire 23, and the drain wire 24 can be formed by patterning of the same layer, and the gate terminal 3 and the connecting line 19b are connected to each other via a through-hole (not illustrated).

Moreover, although not illustrated, the connecting line 19b and the source and drain wires 23 and 24 are formed by the same layer in the place where the connecting line 19b is formed. Therefore, for the avoidance of an overlap between the connecting line 19b and the source and drain wires 23 and 24, each of the source and drain wires 23 and 24 is divided into two parts so as not to overlap the connecting line 19b.

In the present embodiment, since the gate terminal 3 and the intermediate regions in the row-wise direction of the gate wires 18 are connected to each other via the gate wiring trunk line 19a and the connecting line 19b, it is possible, for example, to reduce variations in wiring resistance as caused in a case where the gate terminal 3 and an end of a gate wire 18 are connected to each other.

In the present embodiment, the connecting line 19 needs only be connected to the intermediate region in the column-wise direction of the gate wiring trunk line 19a while avoiding contact with the adjacent gate wires 18. It should be noted that in a case where five fingers 1 are disposed in the column-wise direction as in the case of the present embodiment, the intermediate region in the column-wise direction of the gate wiring trunk line 19a means that part of the gate wiring trunk line 19a which is present between fingers 1 in the third column.

Such a normally-off semiconductor device 30a, which further includes only the gate wiring trunk line 19a and the connecting line 19b as wires, makes it possible to, without a great increase in wiring area, reduce the variations in the delay of transmission of a signal inputted via the gate terminal 3 among the plurality of fingers 1 as caused due to the influence of wiring resistance and to prevent a breakdown from occurring due to the concentration of electric power on a particular finger 1, thus making it possible to achieve a semiconductor device 30a and a composite semiconductor device with improved response performance and reliability.

It should be noted that, in the present embodiment, the Zener diode 5 is disposed at a first end of the normally-off semiconductor device 30a and the gate terminal 3 is disposed a second end of the normally-off semiconductor device 30a opposite to the first end so that the influence of an overall wiring delay that may occur due to an increase in the length of the connecting line 19b in a case where the Zener diode 5 is present between the gate terminal 3 and the block 17 is eliminated. However, without being bound by this, the Zener diode 5 may be present between the gate terminal 3 and the block 17.

Embodiment 3

Next, Embodiment 3 of the present invention is described with reference to FIG. 10. The present embodiment differs from Embodiment 2 in that a normally-off semiconductor device according to the present embodiment includes a connecting line 19c passing through the centers of fingers 1 in a row concerned. In other respects, the present embodiment is the same as Embodiment 2. For convenience of explanation, members having the same functions as those illustrated in the drawings of Embodiment 2 are given the same reference signs and, as such, are not described below.

Figure 10:
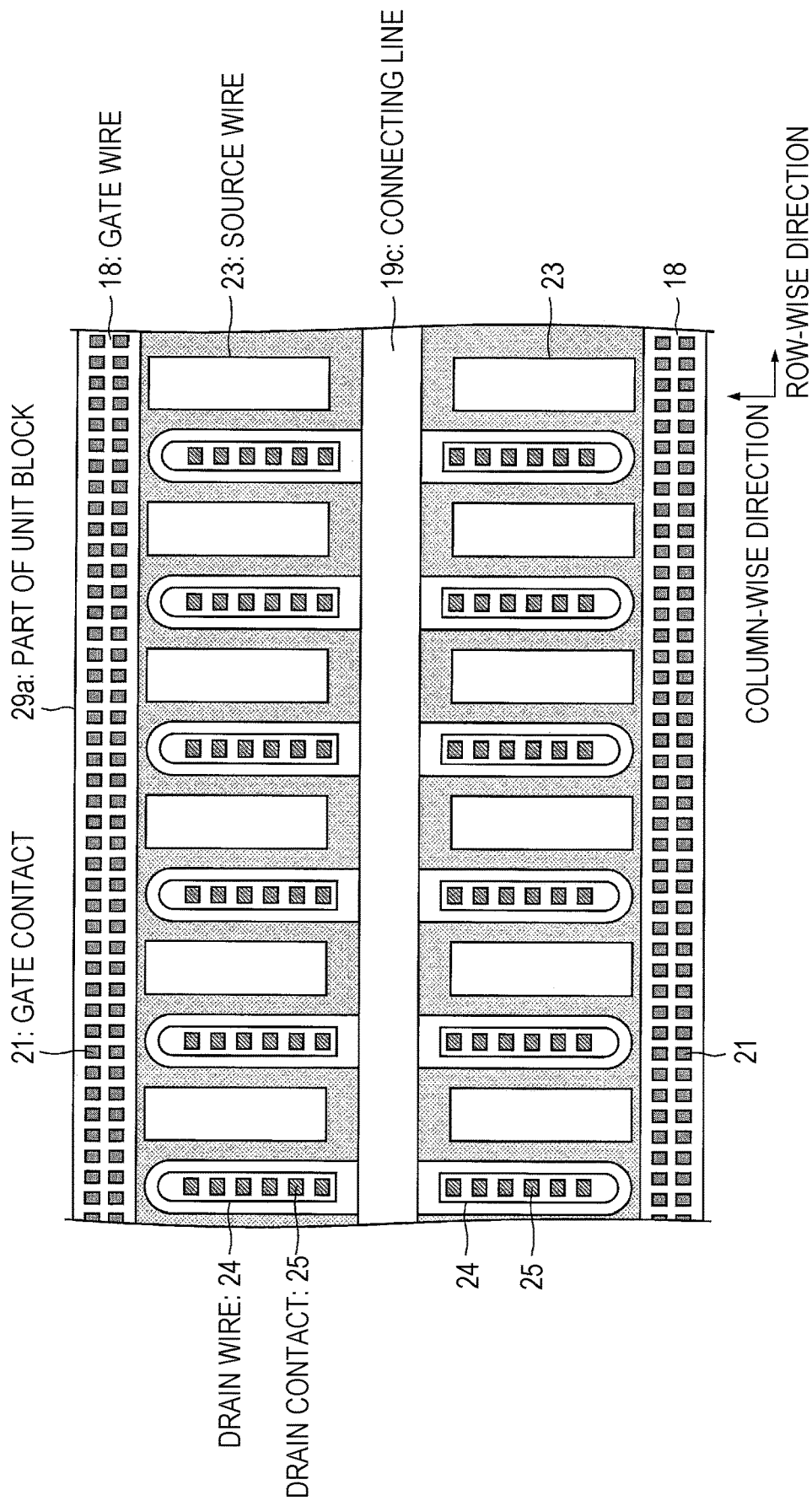
FIG. 10 is a diagram showing a part of a unit block constituted by a plurality of normally-off fingers of a semiconductor device of a composite semiconductor device according to Embodiment 3 of the present invention.

FIG. 10 is a diagram showing a part 29a of a unit block in which the connecting line 19c is formed.

The connecting line 19c is formed along the gate wires 18 and connects the intermediate region in the column-wise direction of the gate wiring trunk line 19a (not illustrated) with the gate terminal 3 (not illustrated).

As illustrated, the connecting line 19c is disposed to pass through the central parts in the column-wise direction of the fingers in the unit block, i.e. the central part in the column-wise direction of the unit block.

Moreover, the connecting line 19c and the source and drain wires 23 and 24 are formed by the same layer in the place where the connecting line 19c is formed. Therefore, for the avoidance of an overlap between the connecting line 19c and the source and drain wires 23 and 24, each of the source and drain wires 23 and 24 is divided into two parts so as not to overlap the connecting line 19c.

According to such a configuration, the central parts in the column-wise direction of the fingers, where the fingers are highest in gate resistance, are used as a wiring region. Therefore, the biggest delay factor that is constituted by gate resistance and gate capacitance is eliminated. This makes it possible to reduce the effect of the provision of the connecting line 19c on the response characteristics of the normally-off semiconductor device. This in turn makes it possible to, without a great increase in wiring area, reduce the variations in the delay of transmission of a signal inputted via the gate terminal 3 among the plurality of fingers 1 as caused due to the influence of wiring resistance and to prevent a breakdown from occurring due to the concentration of electric power on a particular finger 1, thus making it possible to achieve a semiconductor device and a composite semiconductor device with improved response performance and reliability.

Embodiment 4

Next, Embodiment 4 of the present invention is described with reference to FIG. 11. The present embodiment differs from Embodiments 2 and 3 in that a normally-off semiconductor device according to the present embodiment includes a connecting line 19d whose width in the column-wise direction is wider than the width in the column-wise direction of each of the gate wires 18. For convenience of explanation, members having the same functions as those illustrated in the drawings of Embodiments 2 and 3 are given the same reference signs and, as such, are not described below.

Figure 11:
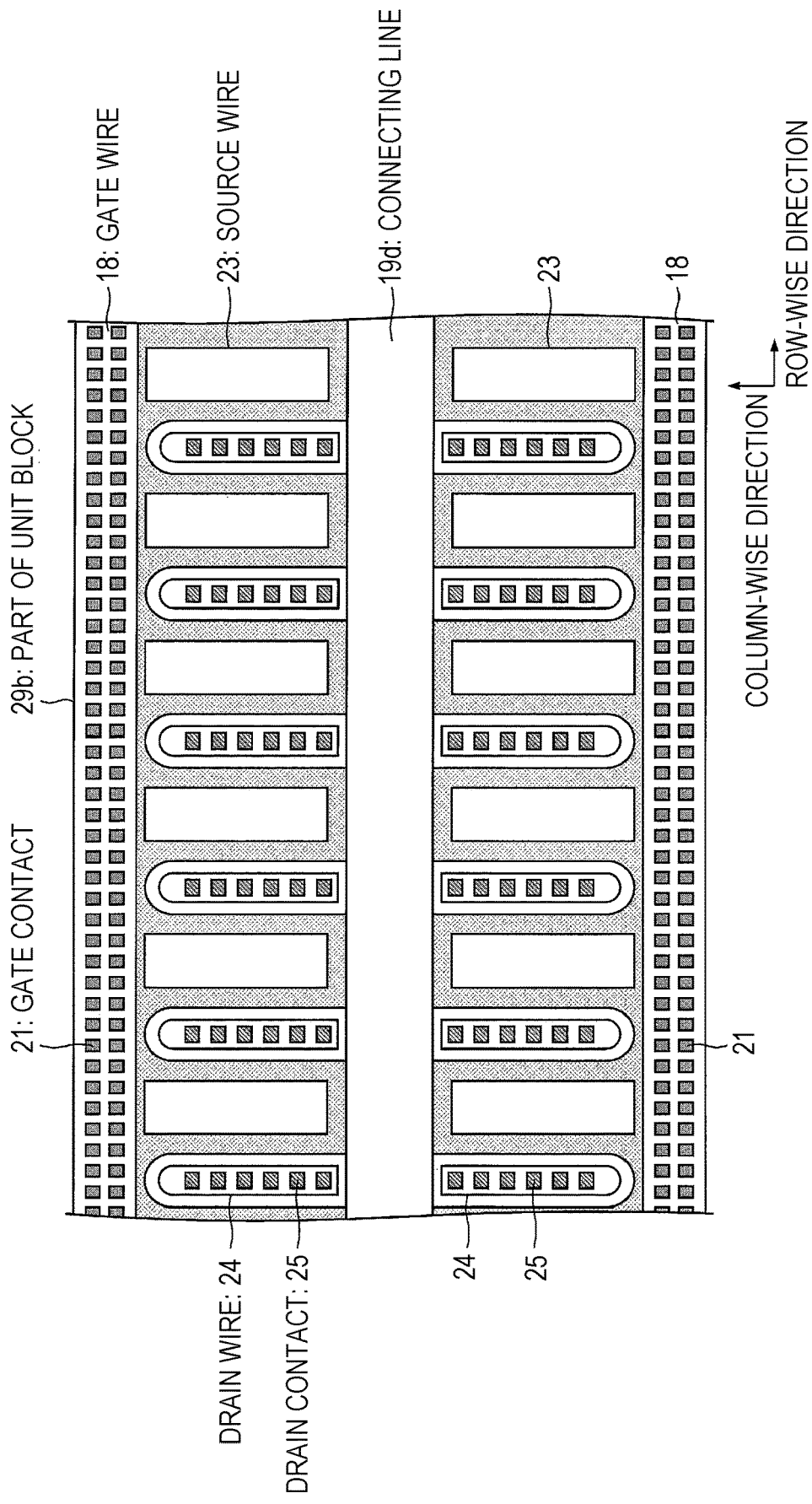
FIG. 11 is a diagram showing a part of a unit block constituted by a plurality of normally-off fingers of a semiconductor device of a composite semiconductor device according to Embodiment 4 of the present invention.

FIG. 11 is a diagram showing a part 29b of a unit block in which the connecting line 19d is formed.

The connecting line 19d is formed along the gate wires 18 and connects the intermediate region in the column-wise direction of the gate wiring trunk line 19a (not illustrated) with the gate terminal 3 (not illustrated).

As illustrated, the width in the column-wise direction of the connecting line 19d is wider than the width in the column-wise direction of each of the gate wires 18. Moreover, the connecting line 19d and the source and drain wires 23 and 24 are formed by the same layer in the place where the connecting line 19d is formed. Therefore, for the avoidance of an overlap between the connecting line 19d and the source and drain wires 23 and 24, each of the source and drain wires 23 and 24 is divided into two parts so as not to overlap the connecting line 19d.

As noted above, the width in then column-wise direction of the connecting line 19d is wider than the width in the column-wise direction of each of the gate wires 18. This makes it possible to lower the wiring resistance of the connecting line 19d, on which the flow of a signal inputted via the gate terminal 3 concentrates most. This in turn makes it possible to, without a great increase in wring area, reduce the variations in the delay of transmission of a signal inputted via the gate terminal 3 among the plurality of fingers 1 as caused due to the influence of wiring resistance and to prevent a breakdown from occurring due to the concentration of electric power on a particular finger 1, thus making it possible to achieve a semiconductor device and a composite semiconductor device with improved response performance and reliability.

It should be noted that although, in the present embodiment, the connecting line 19d is disposed in the central arts in the column-wise direction of the fingers so the biggest delay factor that is constituted by gate resistance and gate capacitance is eliminated by using, as a wiring region, the central part in the column-wise direction of the finger, where the fingers are highest in gate resistance, the connecting line 19d does not need to be disposed in the central parts in the column-wise direction of the fingers, provided the connecting line 19d can be connected to the intermediate region in the column-wise direction of the gate wiring trunk line 19a (not illustrated).

Conclusion

A composite semiconductor device according to Aspect 1 of the present invention is a composite semiconductor device including: a semiconductor device including a plurality of normally-off field-effect transistors, a gate terminal, a drain terminal, and a source terminal; a normally-on field-effect transistor; a second gate terminal; a second drain terminal; and a second source terminal, wherein each of the plurality of normally-off field-effect transistors has a gate electrode connected to the gate terminal, a drain electrode connected to the drain terminal, and a source electrode connected to the source terminal, the semiconductor device has a first surface on which the gate terminal and either of the drain terminal and the source terminal are formed and a second surface on which the other of the drain terminal and the source terminal is formed, the second surface being a surface opposite to the first surface, the second drain terminal is connected to a drain electrode of the normally-on field-effect transistor, the second source terminal is connected to a gate electrode of the normally-on field-effect transistor and a source terminal of the semiconductor device, the second gate terminal is connected to a gate terminal of the semiconductor device, a source electrode of the normally-on field-effect transistor is connected to a drain terminal of the semiconductor device, the plurality of normally-off field-effect transistors are arranged in a plurality of rows and a plurality of columns, and a signal inputted via the gate terminal is supplied from intermediate regions in a row-wise direction of gate wires connected to the gate electrodes of the same row or two adjacent rows of field-effect transistors of the plurality of normally-off field-effect transistors and formed along the rows.

According to the foregoing configuration, the plurality of normally-off field-effect transistors are arranged in a plurality of rows and a plurality of columns, and a signal inputted via the gate terminal is supplied from intermediate regions in a row-wise direction of gate wires connected to the gate electrodes of the same row or two adjacent rows of field-effect transistors of the plurality of normally-off field-effect transistors and formed along the rows. This makes it possible to reduce the variations in the delay of transmission of a signal inputted via the gate terminal as caused due to the influence of wiring resistance depending on the locations of the plurality of normally-off field-effect transistors and to prevent a breakdown from occurring due to the concentration of electric power on a particular finger, thus making it possible to achieve a composite semiconductor device with improved response performance and reliability while suppressing an increase in wiring area.

In Aspect 1, a composite semiconductor device according to Aspect 2 of the present invention is preferably configured such that the gate terminal is disposed in a central region of a block including the normally-off field-effect transistors arranged in the plurality of rows and the plurality of columns.

The foregoing configuration makes it possible to reduce the differences in wiring resistance as caused by the differences in the distances between the gate electrodes of the normally-off field-effect transistors and the gate terminal.

In Aspect 1, a composite semiconductor device according to Aspect 3 of the present invention is preferably configured such that the gate terminal is disposed outside a block including the normally-off field-effect transistors arranged in the plurality of rows and the plurality of columns, the composite semiconductor device further including: one trunk line connected to the intermediate regions in the row-wise direction of the gate wires and formed along a column-wise direction; and a connecting line formed along the gate wires and connecting an intermediate region in the column-wise direction of the trunk line with the gate terminal.

The foregoing configuration, which further includes only one gate wiring trunk line and a connecting line as wires, makes it possible to, without a great increase in wiring area, reduce the variations in the delay of transmission of a signal inputted via the gate terminal as caused due to the influence of wiring resistance depending on the locations of the plurality of normally-off field-effect transistors and to prevent a breakdown from occurring due to the concentration of electric power on a particular normally-off field-effect transistor, thus making it possible to achieve a composite semiconductor device with improved response performance and reliability.

In Aspect 3, a composite semiconductor device according to Aspect 4 of the present invention is preferably configured such that a width in the column-direction of the connecting line is wider than a width in the column-wise direction of each of the gate wires.

The foregoing configuration makes it possible to lower the airing resistance of the connecting line, on which the flow of a signal inputted via the gate terminal concentrates most.

In Aspect 3 or 4, a composite semiconductor device according to Aspect 5 of the present invention is preferably configured such that the connecting line is disposed in central parts in the column-wise direction of the plurality of normally-off field-effect transistors in a row in an intermediate region in the column-wise direction.

According to the foregoing configuration, the central parts in the column-wise direction of the normally-off field-effect transistors, where the normally-off field-effect transistors are highest in gate resistance, are used as a wiring region. Therefore, the biggest delay factor that is constituted by gate resistance and gate capacitance is eliminated. This makes it possible to reduce the effect of the provision of the connecting line on the response characteristics of the composite semiconductor device.

In any of Aspects 1 to 5, a composite semiconductor device according to Aspect 6 of the present invention is preferably configured such that the normally-on field-effect transistor includes a semiconductor layer composed of GaN or SiC.

The foregoing configuration makes it possible to achieve a normally-on field-effect transistor that is low in on resistance per unit area, thus allowing passage of a larger current.

In any of Aspects 1, 3, 4, and 5, a composite semiconductor device according to Aspect 7 of the present invention is preferably configured to further include a Zener diode having an anode electrode connected to the source terminal and a cathode electrode connected to the drain terminal, and is preferably configured such that the Zener diode is provided at a first end of the semiconductor device and the gate terminal is provided at a second end of the semiconductor device opposite to the first end.

According to the foregoing configuration, since the Zener diode is provided, a breakdown can be prevented from occurring in a case where a voltage that is equal to or higher than the withstand voltage of the semiconductor device is applied to the semiconductor device. Further, according to the foregoing configuration, since the Zener diode is provided at a first end of the semiconductor device and the gate terminal is provided at a second end of the semiconductor device opposite to the first end, the influence of a signal delay that may occur in a case where the Zener diode is present between the gate terminal and the block can be eliminated.

In any of Aspects 1 to 7, a composite semiconductor device according to Aspect 6 of the present invention is preferably configured such that, on the first surface, the gate terminal is exposed to outside the semiconductor device via an opening formed in either of the drain terminal and the source terminal.

The foregoing configuration allows the gate terminal and either of the drain terminal and the source terminal to be formed on the first surface by patterning of the same layer.

The present invention is not limited to the description of the embodiments above, but may be altered within the scope of the claims. An embodiment based on a proper combination of technical means disclosed in different embodiments is encompassed in the technical scope of the present invention.

INDUSTRIAL APPLICABILITY

The present invention is suitably applicable to a semiconductor device and a composite semiconductor device.

REFERENCE SIGNS LIST

1 Finger (normally-off field-effect transistor)
2 Drain terminal
3 Gate terminal
4 Source terminal
5 Zener diode
13 Pulse generator
14 Termination resistor
15 Load resistor
16 Power source
17 Block
18 Gate wire
19 Gate wiring trunk line (trunk line)
19a Gate wiring trunk line (trunk line)
19b Connecting line
19c Connecting line
19d Connecting line
20 Drain terminal opening
21 Gate contact
22 Polysilicon gate
23 Source wire
24 Drain wire
25 Drain contact
26 Substrate
29 Unit block
29a Part of unit block
29b Part of unit block
30 Semiconductor device
30a Semiconductor device
31 Normally-on field-effect transistor
32 Drain terminal of composite semiconductor device (second drain terminal)
33 Gate terminal of composite semiconductor device (second gate terminal)
34 Source terminal of composite semiconductor device (second source terminal)
40 Composite semiconductor device
41 Die pad
45 First wire
46 Second wire
47 Third wire
48 Fourth wire
49 Package
G Gate electrode of finger
S Source electrode of finger
D Drain electrode of finger
A Anode electrode
C Cathode electrode

The invention claimed is:

1. A composite semiconductor device comprising:
a semiconductor device including a plurality of normally-off field-effect transistors, a gate terminal, a drain terminal, and a source terminal;
a normally-on field-effect transistor;
a second gate terminal;
a second drain terminal; and
a second source terminal,
wherein each of the plurality of normally-off field-effect transistors has a gate electrode connected to the gate terminal, a drain electrode connected to the drain terminal, and a source electrode connected to the source terminal,
the semiconductor device has a first surface on which the gate terminal and either of the drain terminal and the source terminal are formed and a second surface on which the other of the drain terminal and the source terminal is formed, the second surface being a surface opposite to the first surface,
the second drain terminal is connected to a drain electrode of the normally-on field-effect transistor,
the second source terminal is connected to a gate electrode of the normally-on field-effect transistor and a source terminal of the semiconductor device,
the second gate terminal is connected to a gate terminal of the semiconductor device,
a source electrode of the normally-on field-effect transistor is connected to a drain terminal of the semiconductor device,
the plurality of normally-off field-effect transistors are arranged in a plurality of rows and a plurality of columns, and
the semiconductor device includes gate wires connected to the gate electrodes of the same row or two adjacent rows of field-effect transistors of the plurality of normally-off field-effect transistors and formed along the rows,
the gate terminal is disposed outside a block including the normally-off field-effect transistors arranged in the plurality of rows and the plurality of columns,
the semiconductor device includes one trunk line connected to intermediate regions in a row-wise direction of the gate wires and formed along a column-wise direction and a connecting line formed along the gate wires and connecting an intermediate region in the column-wise direction of the trunk line with the gate terminal,
a signal inputted via the gate terminal, the connecting line, and the trunk line is supplied from the intermediate regions in the row-wise direction of the gate wires.

2. The composite semiconductor device according to claim 1, wherein a width in the column-direction of the connecting line is wider than a width in the column-wise direction of each of the gate wires.

3. The composite semiconductor device according to claim 1, wherein the connecting line is disposed in central parts in the column-wise direction of the plurality of normally-off field-effect transistors in a row in an intermediate region in the column-wise direction.

4. The composite semiconductor device according to claim 2, wherein the connecting line is disposed in central parts in the column-wise direction of the plurality of normally-off field-effect transistors in a row in an intermediate region in the column-wise direction.

\* \* \* \* \*